(12) United States Patent
Cheah et al.

(10) Patent No.: US 8,697,495 B2
(45) Date of Patent: Apr. 15, 2014

(54) STACKED DIE PACKAGE

(75) Inventors: Bok Eng Cheah, Penang (MY);
Shanggar Periaman, Penang (MY);
Kooi Chi Ooi, Penang (MY); Yen Hsiang Chew, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/231,953

(22) Filed: Sep. 13, 2011

(65) Prior Publication Data
US 2012/0003792 A1    Jan. 5, 2012

Related U.S. Application Data

(62) Division of application No. 11/852,904, filed on Sep. 10, 2007, now Pat. No. 8,044,497.

(51) Int. Cl.
*H01L 21/50* (2006.01)

(52) U.S. Cl.
USPC ............. 438/109; 438/74; 438/106; 438/107; 257/E21.499; 257/686; 257/E21.614

(58) Field of Classification Search
USPC ............ 438/109, 74, 106, 107; 257/E21.499, 257/686, E21.614
See application file for complete search history.

(56) References Cited

U.S. PATENT DOCUMENTS

| 6,465,892 | B1 * | 10/2002 | Suga | 257/777 |
| 6,958,546 | B2 * | 10/2005 | Fan et al. | 257/773 |
| 7,217,631 | B2 * | 5/2007 | Suga | 438/406 |
| 7,355,273 | B2 * | 4/2008 | Jackson et al. | 257/686 |

* cited by examiner

*Primary Examiner* — Tom Thomas
*Assistant Examiner* — Benjamin Tzu-Hung Liu
(74) *Attorney, Agent, or Firm* — Konrad Raynes Davda & Victor LLP; Alan S. Raynes

(57) ABSTRACT

The formation of electronic assemblies is described. One embodiment includes first and second semiconductor die structures each including a front side and a backside, the front side including an active region and the backside including metal regions and non-metal regions thereon. The first and second semiconductor die structures include a plurality of vias, the vias forming electrical connections between the active region and the backside metal regions. The first and second semiconductor die structures are stacked together with at least one of the metal regions on the backside of the first semiconductor die structure in direct contact with at least one of the metal regions on the back side of the second semiconductor die structure. Other embodiments are described and claimed.

12 Claims, 4 Drawing Sheets

STACKED DIE PACKAGE

This application is a divisional of U.S. patent application Ser. No. 11/852,904 filed Sep. 10, 2007, issued as U.S. Pat. No. 8,044,497, each of which is hereby incorporated by reference in its entirety.

BACKGROUND

As performance increases and electronic device sizes decrease, problems relating to the connections between multiple die structures and between die structures and other elements have developed. For example, such problems may relate to the undesirably long path that metal traces travel to reach active regions on a die, due to the system architecture. Problems may also relate to the lower die in a stacked die structure carrying the entire power source for the upper die(s), which can create undesirable thermal stresses. Conventional stacked die structures may also have problems relating to the height of the assembly, with the interconnection between the stacked die structures being undesirably large.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic device assemblies and methods for their manufacture. Embodiments may include the use of first and second die structures stacked with the backside metallization surface of the second die structure positioned on the backside metallization surface of the first die structure.

Figure 1:
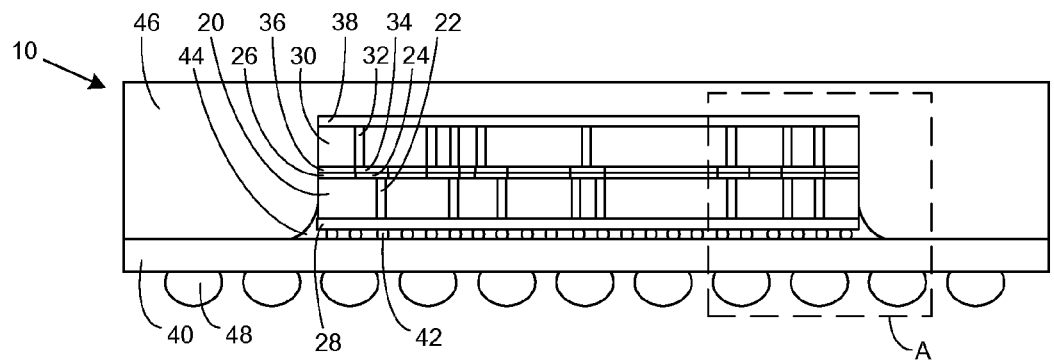
FIG. 1 illustrates an electronic assembly including first and second die structures stacked backside surface to backside surface, in accordance with certain embodiments.

FIG. 1 illustrates an embodiment including an electronic assembly 10 including a first semiconductor die structure 20 and a second semiconductor die structure 30 positioned thereon. The die structures 20, 30 may be formed to include similar electronic devices formed therein or may be formed to include different electronic devices. The die structures 20, 30 each include a front side active region 28, 38 and a backside metallization region including backside metal regions 24, 34 and backside dielectric regions 26, 36. The front side active region may include devices such as transistors and the like formed in and on the semiconductor die, as well as metal and dielectric layers formed thereon. The die structures also each include a plurality of vias 22, 32 that electrically couple the front side active regions 28, 38 to the backside metal regions 24, 34. The vias 22, 32 include an electrically conductive material such as a metal, that either partially or completely fills the vias 22, 32 and acts to transmit electrical signals therethrough. Examples of via fill materials include, but are not limited to, metals such as aluminum, copper, silver, gold, and combinations thereof.

As illustrated in FIG. 1, the die structures 20, 30 are positioned so that the backside metallization regions of each are facing each other. The outermost surface of the backside metallization regions of the die structures 20, 30 include metal regions 24, 34 and dielectric regions 26, 36. The surfaces may be coupled to each other using a suitable method. In certain embodiments, a surface activated bonding (SAB) technique is used. In typical SAB techniques, two solid surfaces are cleaned atomically using ions such as Argon ions, or using a fast atom beam, in an ultra high vacuum (UHV) chamber at room temperature. When the surfaces are brought into close contact with each other, an adhesion develops between the atoms of the cleaned surfaces. In other embodiments, other types of electrical interconnection techniques may be used to couple the backside of a first die structure to the backside of a second die structure, including, for example, solder bump bonding.

The stacked die structures 20, 30 may be positioned on a substrate 40, and coupled to the substrate 40 using any suitable technique, for example, using solder bump connections 42. The substrate 40 may be formed from materials including, but not limited to, polymer and ceramic materials. A suitable underfill material 44 may be positioned around and between the die structure 20 and the substrate 40. In the embodiment illustrated in FIGS. 1-2, the underfill material 44 may flow a distance up at least some of the side surfaces of the die structure 20. An example of a suitable underfill material 44 is a polymer epoxy. The underfill material 44 may be dispensed using a suitable method including, but not limited to, capillary dispense, lamination, spin dispense, and jet dispense. A molding compound 46, for example, a polymer, may be formed to cover exposed portions of the substrate 40 and the stacked die structures 20, 30. The assembly 10 may be coupled to another structure, such as a board, using any suitable technique, for example, using solder bump connections 48.

Figure 2:
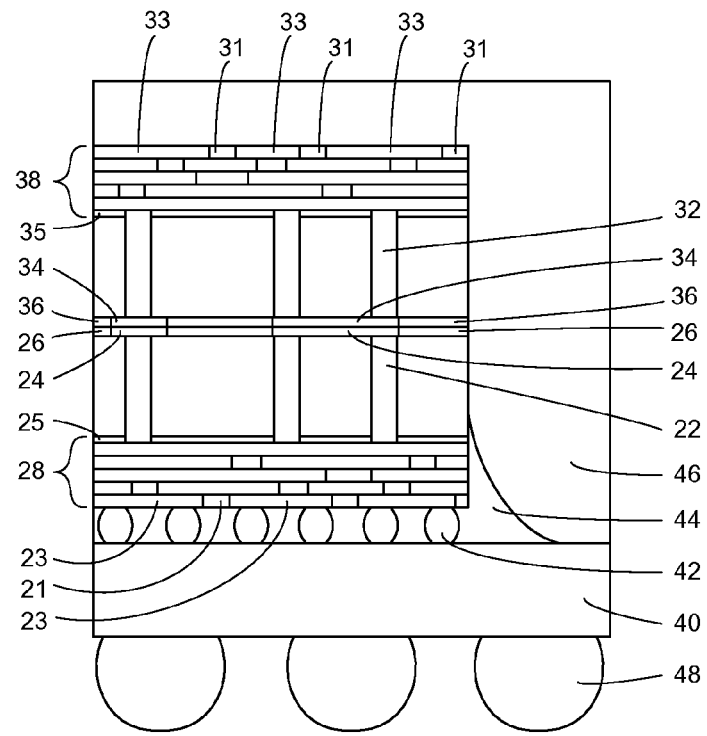
FIG. 2 illustrates a detailed view of region A of FIG. 1, in accordance with certain embodiments.

FIG. 2 illustrates a blown-up view of region A of FIG. 1. The active regions 28, 38 of the die structures 20, 30 may include a plurality of layers, including one or more layers 25, 35 that include electronic devices such as transistors and the like, as well as a plurality of layers including metal regions 23, 33 and dielectric regions 21, 31. Within a single layer, the dielectric regions 21, 31 may be positioned between metal regions 23, 33. The metal regions 23, 33 and the dielectric regions 21, 31 may be formed using any suitable CMOS processing methods. The term metal as used herein includes pure metals and alloys. The term dielectric as used herein includes materials formed from electrically insulating materials including, but not limited to, oxides and polymers.

The active region 28 of the die structure 20 (the lower die structure in FIGS. 1-2) is coupled to the substrate 40 through the solder bump bonds 42. The active region 38 of the die structure 30 (the upper die structure in FIGS. 1-2) may be electrically coupled to other devices (not shown in FIGS.

1-2), for example, a third semiconductor die structure. Such a device may be electrically coupled to the die structure 30 using any suitable technique, for example, a solder bump connection technique or a surface activated bonding technique. Alternatively, the active region 38 of the die structure 30 may be electrically coupled to the substrate 40 using, for example, wire bonds.

Figure 3:
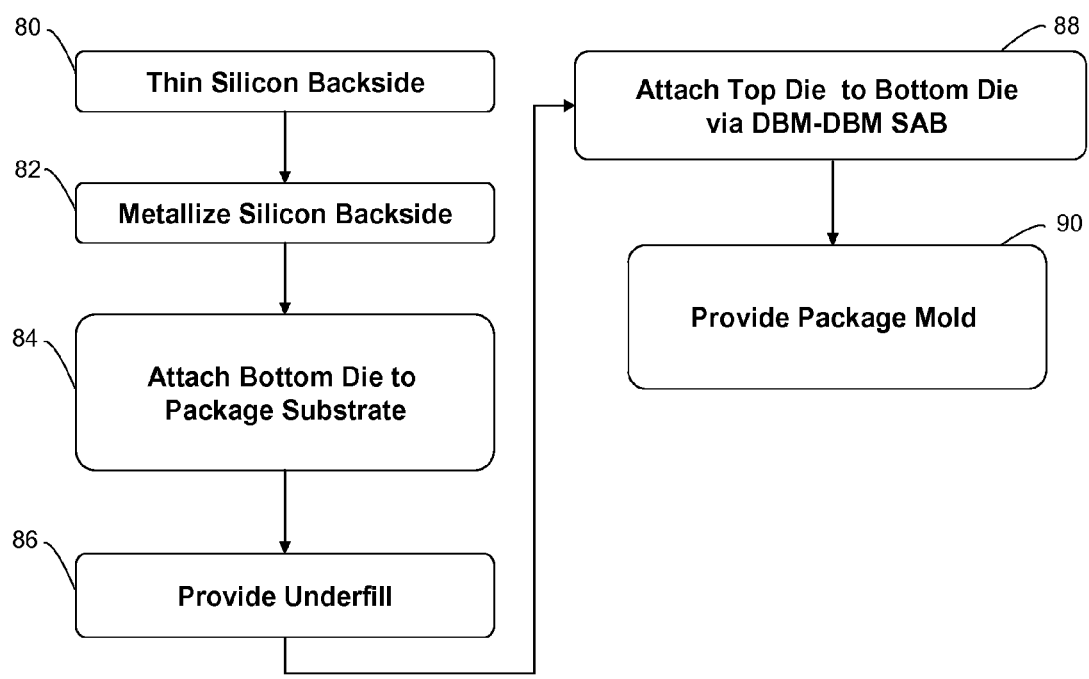
FIG. 3 illustrates a flow chart of operations for forming an electronic assembly including first and second die structures stacked backside surface to backside surface, in accordance with certain embodiments.

FIG. 3 illustrates a flow chart of operations for forming a stacked die assembly in accordance with certain embodiments. Box 80 is thinning a silicon semiconductor wafer from the backside, which may be done after formation of an active region and plurality of vias. Box 82 is forming the backside metallization, which may include forming both metal and dielectric layers. An example of process operations for forming a backside metallization region is described below, in connection with FIGS. 4 and 5(A)-5(J). Box 84 is attaching a bottom die to a package substrate. This may be carried out using any suitable technique, for example, bump bonding. Box 86 is providing an underfill material that is positioned between the bottom die and the package substrate. Box 88 is attaching a top die to the bottom die with a back side metallization surface of the first die facing a backside metallization surface of the second die. The attachment may be carried out using a suitable surface active bonding (SAB) technique. Box 90 is providing a package molding material such as a polymer, that covers the bottom and top die structures and the package substrate. The order of at least some of the operations specified in the flow chart may be interchangeable.

Figure 4:
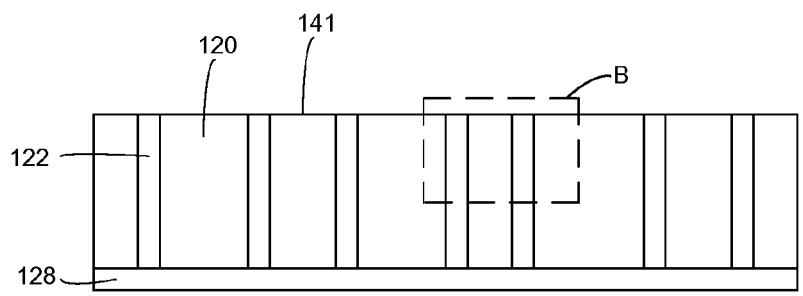
FIG. 4 illustrates a die structure in accordance with certain embodiments.

FIG. 4 illustrates a semiconductor die structure 120 in accordance with certain embodiments. The die structure 120 includes a plurality of vias 122 extending through the semiconductor and an active region 128 on a front side. The die structure 120 also includes a backside surface 141. The region B of FIG. 4 (in dotted lines) is discussed in connection with FIGS. 5(A)-5(J), which describe processing operations in accordance with certain embodiments.

Figure 5A:
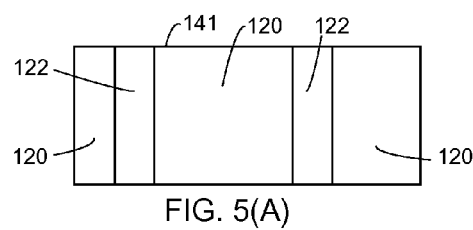
FIGS. 5(A)-5(J) illustrate processing operations for forming a die structure including metallization layers on a backside surface thereof, in accordance with certain embodiments.
Figure 5B:
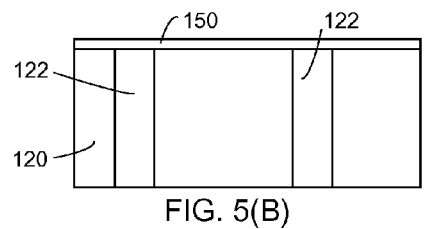
Figure 5C:
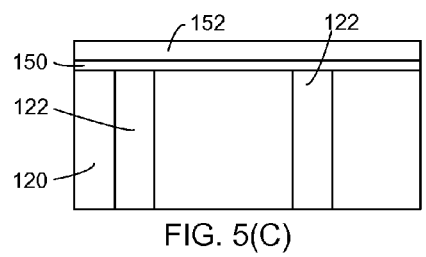
Figure 5D:
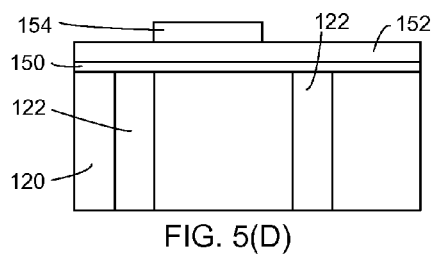
Figure 5E:
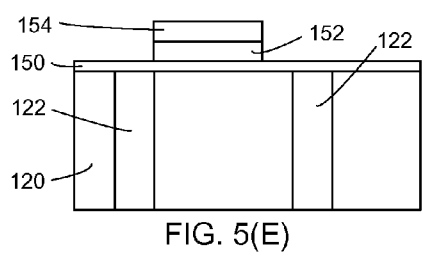

FIG. 5(A) illustrates a blown-up view of the region B of FIG. 4, which shows a portion of the semiconductor die structure 120 including a plurality of vias 122 and backside surface 141. If desired, the die may be thinned from the backside surface 141. The vias 122 may be partially or totally filled with a conductive material such as a metal. FIG. 5(B) illustrates forming a nitride layer 150 on the backside surface 141, using a suitable deposition process. The nitride layer 150 may be formed to cover at least a portion of the vias 122. FIG. 5(C) illustrates forming a passivation layer 152 formed to cover the nitride layer, using a suitable deposition process. An example of a passivation layer 152 material is silicon oxide. FIG. 5(D) illustrates forming and patterning a first photoresist layer 154 on the passivation layer 152. The patterned first photoresist layer 154 acts as a mask. FIG. 5(E) illustrates removal of the unmasked portions of the passivation layer 152. The removal may be carried out using a suitable process such as etching. The nitride layer 150 may act as an etch stop material. After the removal operation, only a portion of the backside surface 141 is covered with the passivation layer 152 and the first photoresist layer 154.

Figure 5F:
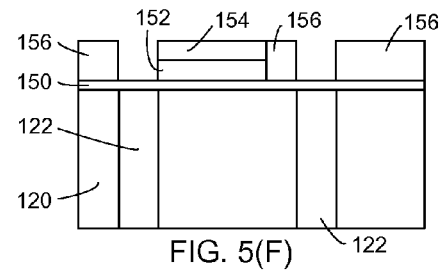
Figure 5G:
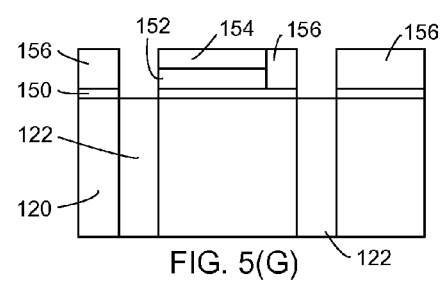
Figure 5H:
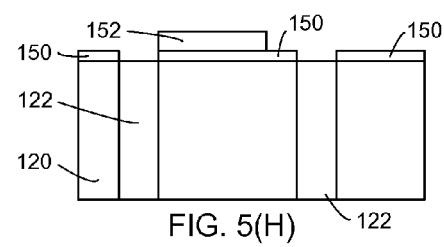

FIG. 5(F) illustrates forming and patterning a second photoresist layer 156 on portions of the remaining exposed nitride layer 150, with the second patterned photoresist layer 156 not being formed on nitride layer regions directly over the vias 122. FIG. 5(G) illustrates removal of the nitride layer 150 over the vias 122. The exposed nitride layer 150 over the vias may be removed using a suitable process such as etching. FIG. 5(H) illustrates removal of the second patterned photoresist layer 156 and remaining first patterned photoresist layer 154, leaving a structure include the remaining nitride layer 150, which includes openings extending therethrough above the vias 122, and a remaining portion of the passivation layer 152.

Figure 5I:
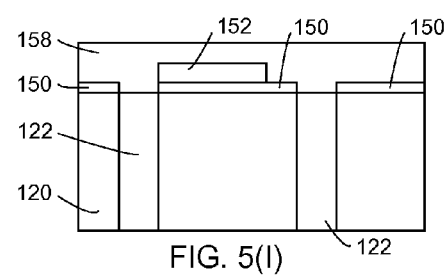
Figure 5J:
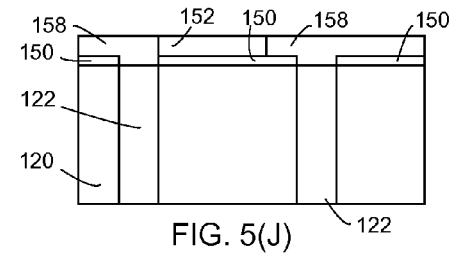

FIG. 5(I) illustrates forming an electrically conductive layer such as a metal layer 158, for example, copper, on the remaining exposed nitride layer 150, the remaining portion of the passivation layer 152, and on the vias 122. FIG. 5(J) illustrates removing part of the metal layer 158 to expose the remaining passivation layer 152. The resultant structure includes vias 122 electrically coupled to the metal layer 158, with the remaining passivation layer 152 acting to electrically isolate adjacent regions of the metal layer 158 from each other.

Operations such as described above and illustrated in FIGS. 5(A)-5(J) may be used for forming the backside metallization region on a die, such as the backside metal regions 24, 34 and the backside dielectric regions 26, 36 on the die structures 20, 30 in FIGS. 1 and 2.

Assemblies as described in embodiments above may find application in a variety of electronic components. In certain embodiments, a device or devices in accordance with the present description may be embodied in a computer system including a video controller to render information to display on a monitor coupled to the computer. The computer system may comprise one or more of a desktop, workstation, server, mainframe, laptop, handheld computer, handheld gaming device, handheld entertainment device (for example, a video player), PDA (personal digital assistant), telephony device (wireless or wired), etc. Alternatively, a device or devices in accordance with the present description may be embodied in a computing device that does not include a video controller, such as a switch, router, etc.

Figure 6:
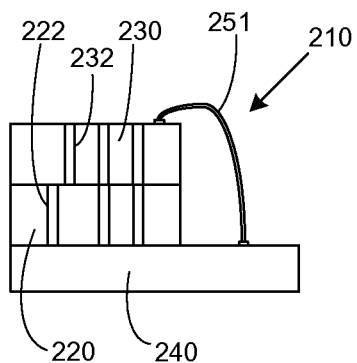
FIG. 6 illustrates an assembly including first and second die structures stacked backside surface to backside surface on a substrate, in which the second die structure is wire bonded to the substrate, in accordance with certain embodiments.
Figure 7:
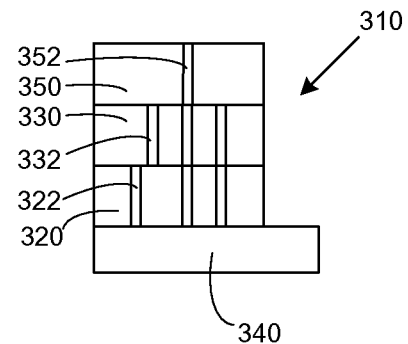
FIG. 7 illustrates an assembly including first, second, and third structures, in which two of the structures are stacked backside surface to backside surface on a substrate, in accordance with certain embodiments.

FIGS. 6-7 illustrate certain assembly structures which may be formed in accordance with certain embodiments. FIG. 6 illustrates a portion of an assembly, including first and second die structures 220, 230, coupled to a substrate 240. The die structures have vias 222, 232 therein. These die structures may be formed to include similar electronic devices or may be formed to include different electronic devices. Certain layers on the die structures, including backside metal layers, dielectric layers, and active region layers, have been omitted. The die structures 220, 230 include backside metallization regions that are facing each other and which may be coupled together using a method such as described above, for example, SAB. As seen in FIG. 6, the upper die structure 230 may be wire bonded to the substrate 240, through wire bond 251.

FIG. 7 illustrates a portion of an assembly including first, second, and third structures 320, 330, 350, coupled to a substrate 340. The structures have vias 322, 332, 352 therein. These structures may be semiconductor die structures formed to include similar electronic devices or may be formed to include different electronic devices formed therein. Certain layers on the structures, including backside metal layers, dielectric layers, and active region layers, have been omitted. In one embodiment, the lower structure 320 and middle structure 330 include backside metallization regions that are facing each other and which may be coupled together using a method such as described above, for example, SAB. The upper structure 350 may be coupled to the middle structure 330 using a suitable method, for example, SAB or a solder bump bonding process. In certain embodiments, the upper structure 350 may be wire bonded or otherwise electrically coupled to the substrate 340 or to another device (not shown), if desired. In an alternative embodiment, the middle structure 330 and the upper structure 350 may be stacked with backside metallization regions facing each other.

Certain embodiments as described herein may include one or more advantages, including, but not limited to: (i) enabling a shorter path between active regions on multiple die structures, which can improve communication speed and efficiency; (ii) enabling the integration of different types of devices into a single assembly package; (iii) enabling efficient vertical connections between devices; (iv) providing efficient electronic connection to stacked dies; (v) minimizing thermal expansion mismatch and stresses between stacked die structures; and (vi) forming of a compact assembly package integrating multiple die structures. It will be appreciated that not all embodiments provide all the advantages mentioned above, and other advantages may also be apparent to one of ordinary skill.

Figure 8:
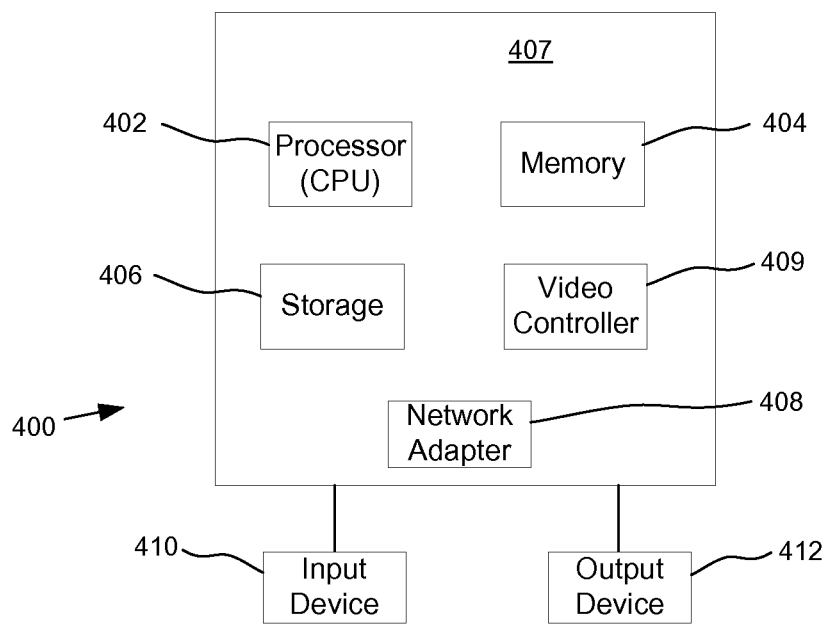
FIG. 8 is an electronic system arrangement in which certain embodiments may find application.

FIG. 8 schematically illustrates one example of an electronic system environment in which aspects of described embodiments may be embodied. Other embodiments need not include all of the features specified in FIG. 8, and may include alternative features not specified in FIG. 8. FIG. 8 illustrates an embodiment of a device including a computer architecture 400 which may utilize integrated circuit devices having a structure including capacitors formed in accordance with embodiments as described above. The architecture 400 may include a CPU 402, memory 404 (including, for example, a volatile memory device), and storage 406 (including, for example, a non-volatile storage device, such as magnetic disk drives, optical disk drives, etc.). The CPU 402 may be coupled to a printed circuit board 407, which in this embodiment, may be a motherboard. The CPU 402 is an example of a package substrate assembly formed in accordance with the embodiments described above and illustrated, for example, in FIG. 1. In one embodiment, a first CPU die may be coupled to a second CPU die in accordance with embodiments described above, to form CPU 402. Embodiments may also include multiple system components formed in a single package assembly (i.e. with die structures including different devices being coupled together). For example, a CPU die may be coupled to another die such as a memory chip, a chipset, or some other device, to form an assembly. A variety of other system components, including, but not limited to input/output devices, controllers, memory and other components, may also include structures formed in accordance with the embodiments described above. The system components may be formed on the motherboard, or may be disposed on other cards such as daughter cards or expansion cards.

The storage 406 may comprise an internal storage device or an attached or network accessible storage. Programs in the storage 406 may be loaded into the memory 404 and executed by the CPU 402 in a manner known in the art. The architecture may further include a network adapter or controller 408 to enable communication with a network, such as an Ethernet, a Fibre Channel Arbitrated Loop, etc. Further, the architecture may, in certain embodiments, also include a video controller 409, to render information on a display monitor, where the video controller may be embodied on a video card or integrated on integrated circuit components mounted on the motherboard, for example. Other controllers may also be present to control other devices.

An input device 410 may be used to provide input to the CPU 402, and may include, for example, a keyboard, mouse, pen-stylus, microphone, touch sensitive display screen, or any other suitable activation or input mechanism. An output device 412 including, for example, a monitor, printer, speaker, etc., capable of rendering information transmitted from the CPU 402 or other component, may also be present.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A process comprising:
providing first and second semiconductor die structures each including a front side and a backside, the front side including an active region and the backside including metal regions thereon, the active region electrically connected to the backside metal regions through a plurality of vias; and
bonding the first and second semiconductor die structures together so that at least one of the backside metal regions of the first semiconductor die structure is in direct physical contact with at least one of the backside metal regions of the second semiconductor die structure;
wherein the backside metal regions on the first and second semiconductor die structures are formed using a method comprising:
forming a nitride layer on the backside of the semiconductor die structure;
forming a passivation layer on the nitride layer, wherein the nitride layer is positioned between the semiconductor die structure and the passivation layer;
removing portions of the passivation layer and nitride layer from the backside of the semiconductor die structure to form remaining passivation layer and nitride layer regions;
forming a layer comprising copper that covers the vias and the remaining passivation layer and nitride layer regions on the backside of the semiconductor die structure; and
removing part of the layer comprising copper to expose the remaining passivation layer regions and to form a structure including copper regions separated by the remaining passivation layer and nitride layer regions;
wherein the layer comprising copper is positioned in direct physical contact with the nitride layer.

2. The process of claim 1, wherein the plurality of vias electrically couple the front side to the backside of the semiconductor die structures, wherein the bonding the first and second semiconductor die structures together is carried out using surface activated bonding, and wherein prior to the bonding, at least some of the vias in the first semiconductor die structure are aligned with at least some of the vias in the second semiconductor die structure.

3. The process of claim 1, further comprising:
coupling the first semiconductor die structure to a first substrate prior to the bonding the first and second semiconductor die structures together, wherein the first semiconductor die structure front side is positioned between the first substrate and the first semiconductor die structure back side; and
coupling the second semiconductor die structure to a third semiconductor die structure prior to the bonding the first and second semiconductor die structures together, wherein the second semiconductor die structure is positioned between the first semiconductor die structure and the third semiconductor die structure.

4. The process of claim 3, wherein the coupling the first semiconductor die structure to the first substrate comprises using a solder connection; and the coupling the second semiconductor die structure to the third semiconductor die structure comprises using a solder connection.

5. A process comprising:
  providing first and second semiconductor die structures each including a front side and a backside, the front side including an active region and the backside including metal regions thereon, the active region electrically connected to the backside metal regions through a plurality of vias; and
  bonding the first and second semiconductor die structures together so that at least one of the backside metal regions of the first semiconductor die structure is in direct physical contact with at least one of the backside metal regions of the second semiconductor die structure;
  wherein the backside metal regions on the first and second semiconductor die structures are formed using a method comprising:
    forming a nitride layer on the backside of the semiconductor die structure;
    forming a passivation layer on the nitride layer, wherein the nitride layer is positioned between the semiconductor die structure and the passivation layer;
    removing portions of the passivation layer and nitride layer from the backside of the semiconductor die structure to form remaining passivation layer and nitride layer regions;
    forming a layer comprising copper that covers the vias and the remaining passivation layer and nitride layer regions on the backside of the semiconductor die structure; and
    removing part of the layer comprising copper to expose the remaining passivation layer regions and to form a structure including copper regions separated by the remaining passivation layer and nitride layer regions, wherein the removing part of the layer comprising copper comprises using a grinding process to form a flat surface including copper regions separated by the exposed passivation layer regions.

6. The process of claim 5, wherein the plurality of vias electrically couple the front side to the backside of the semiconductor die structures, wherein the bonding the first and second semiconductor die structures together is carried out using surface activated bonding, and wherein prior to the bonding, at least some of the vias in the first semiconductor die structure are aligned with at least some of the vias in the second semiconductor die structure.

7. The process of claim 5, further comprising:
  coupling the first semiconductor die structure to a first substrate prior to the bonding the first and second semiconductor die structures together, wherein the first semiconductor die structure front side is positioned between the first substrate and the first semiconductor die structure back side; and
  coupling the second semiconductor die structure to a third semiconductor die structure prior to the bonding the first and second semiconductor die structures together, wherein the second semiconductor die structure is positioned between the first semiconductor die structure and the third semiconductor die structure.

8. The process of claim 7, wherein the coupling the first semiconductor die structure to the first substrate comprises using a solder connection; and the coupling the second semiconductor die structure to the third semiconductor die structure comprises using a solder connection.

9. A process comprising:
  providing first and second semiconductor die structures each including a front side and a backside, the front side including an active region and the backside including metal regions thereon, the active region electrically connected to the backside metal regions through a plurality of vias; and
  bonding the first and second semiconductor die structures together so that at least one of the backside metal regions of the first semiconductor die structure is in direct physical contact with at least one of the backside metal regions of the second semiconductor die structure;
  wherein the backside metal regions on the first and second semiconductor die structures are formed using a method comprising:
    forming a nitride layer on the backside of the semiconductor die structure;
    forming a passivation layer on the nitride layer, wherein the nitride layer is positioned between the semiconductor die structure and the passivation layer;
    removing portions of the passivation layer and nitride layer from the backside of the semiconductor die structure to form remaining passivation layer and nitride layer regions;
    forming a metal layer that covers the vias and the remaining passivation layer and nitride layer regions on the backside of the semiconductor die structure; and
    removing part of the metal layer to expose the remaining passivation layer regions and to form a structure including metal regions separated by the remaining passivation layer and nitride layer regions, wherein the removing part of the metal layer comprises forming a flat surface including metal regions separated by the exposed passivation layer regions.

10. The process of claim 9, wherein the plurality of vias electrically couple the front side to the backside of the semiconductor die structures, wherein the bonding the first and second semiconductor die structures together is carried out using surface activated bonding, and wherein prior to the bonding, at least some of the vias in the first semiconductor die structure are aligned with at least some of the vias in the second semiconductor die structure.

11. The process of claim 9, further comprising:
  coupling the first semiconductor die structure to a first substrate prior to the bonding the first and second semiconductor die structures together, wherein the first semiconductor die structure front side is positioned between the first substrate and the first semiconductor die structure back side; and
  coupling the second semiconductor die structure to a third semiconductor die structure prior to the bonding the first and second semiconductor die structures together, wherein the second semiconductor die structure is positioned between the first semiconductor die structure and the third semiconductor die structure.

12. The process of claim 11, wherein the coupling the first semiconductor die structure to the first substrate comprises using a solder connection; and the coupling the second semiconductor die structure to the third semiconductor die structure comprises using a solder connection.

* * * * *